US012306549B2

(12) United States Patent
Choi et al.

(10) Patent No.: US 12,306,549 B2
(45) Date of Patent: May 20, 2025

(54) PHOTO MASK STAGE UNIT AND PHOTO MASK STOCKER INCLUDING THE SAME

(71) Applicant: SEMES CO., LTD., Cheonan-si (KR)

(72) Inventors: Yun Ho Choi, Osan-si (KR); Seung Won Kim, Yongin-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 111 days.

(21) Appl. No.: 18/146,714

(22) Filed: Dec. 27, 2022

(65) Prior Publication Data

US 2023/0205098 A1 Jun. 29, 2023

(30) Foreign Application Priority Data

Dec. 27, 2021 (KR) .................. 10-2021-0189025
May 11, 2022 (KR) .................. 10-2022-0058036

(51) Int. Cl.
*G03F 7/20* (2006.01)
*G03F 7/00* (2006.01)

(52) U.S. Cl.
CPC .................. *G03F 7/70733* (2013.01)

(58) Field of Classification Search
CPC ............ G03F 7/70733; G03F 7/70741; G03F 7/7075; G03F 1/84; G03F 7/70716; G03F 7/70775; G03F 7/7085
See application file for complete search history.

(56) References Cited

U.S. PATENT DOCUMENTS

| 5,894,056 A * | 4/1999 | Kakizaki ............ G03F 9/7011 355/68 |
| 2011/0041311 A1* | 2/2011 | Hofmann ........... G01R 31/2893 29/464 |
| 2012/0109364 A1* | 5/2012 | Harada ............. H01L 21/67359 206/710 |
| 2020/0124987 A1* | 4/2020 | Park .................. H01L 21/68728 |

FOREIGN PATENT DOCUMENTS

| JP | H07120866 A | 5/1995 |
| KR | 100627688 B1 | 9/2006 |
| KR | 10-2006-0106591 A | 10/2006 |
| KR | 10-2010-0065945 A | 6/2010 |
| KR | 10-1968961 | 4/2019 |
| KR | 10-2020-045161 | 5/2020 |

OTHER PUBLICATIONS

Office Action for Korean Application No. 10-2022-0058036 dated Apr. 12, 2024.

* cited by examiner

*Primary Examiner* — Mesfin T Asfaw
(74) *Attorney, Agent, or Firm* — Harness, Dickey & Pierce, P.L.C.

(57) ABSTRACT

Disclosed is a photo mask stage unit performing alignment on a photo mask, the photo mask stage unit including: an aligning member for aligning the photo mask so that the photo mask is positioned in a proper position; and guide members for supporting edges of the photo mask and guiding the photo mask to the proper position, in which the aligning member pushes the photo mask in a diagonal direction.

20 Claims, 14 Drawing Sheets

PHOTO MASK STAGE UNIT AND PHOTO MASK STOCKER INCLUDING THE SAME

CROSS-REFERENCE TO RELATED APPLICATIONS

This application claims priority to and the benefit of Korean Patent Application Nos. 10-2021-0189025 and 10-2022-0058036 filed in the Korean Intellectual Property Office on Dec. 27, 2021, and May 11, 2022 the entire contents of which are incorporated herein by reference.

TECHNICAL FIELD

The present invention relates to a photo mask treating apparatus.

BACKGROUND ART

A photo mask (or lithography mask or reticle) is used to transfer a photoresist film pattern. When such a photo mask is moved between a lithography station, a processing station, and a storage station, the photo mask is stored in a container (or carrier or cassette) and moved.

Meanwhile, information related to the photo mask (that is, identification information) is displayed on the photo mask itself in a machine-readable type. Here, the machine-readable type may be a barcode or OCR. Therefore, in order to identify the photo mask, vision inspection of the photo mask must be performed. A mask sorter system opens a container, takes out a photo mask, and performs vision inspection while the photo mask is seated on a stage.

However, there is a problem in that the vision inspection is not performed accurately when the photo mask is not properly positioned on the stage where the vision inspection is performed.

SUMMARY OF THE INVENTION

The present invention has been made in an effort to provide a photo mask stage unit capable of accurately aligning a photo mask and a photo mask stocker including the same.

The present invention has also been made in an effort to provide a photo mask stage unit capable of minimizing a contact surface with a photo mask and a photo mask stocker including the same.

The object of the present invention is not limited thereto, and other objects not mentioned will be clearly understood by those of ordinary skill in the art from the following description.

An aspect of the present invention provides a photo mask stage unit performing alignment on a photo mask, the photo mask stage unit including: an aligning member for aligning the photo mask so that the photo mask is positioned in a proper position; and guide members for supporting edges of the photo mask and guiding the photo mask to the proper position, in which the aligning member pushes the photo mask in a diagonal direction.

Further, the guide members may include: a first guide member for supporting a first corner portion where a first side surface and a second side surface of the photo mask meet; and a second guide member positioned diagonally from the first corner portion and supporting a second corner portion where a third side surface and a fourth side surface of the photo mask meet, and the aligning member pushes the photo mask in a diagonal direction from the second edge toward the first corner.

Further, the first guide member may include: a first position determining block for supporting a first bottom corner where a bottom surface and the first side surface of the photo mask meet; and a second position determining block for supporting a second bottom corner where the bottom surface and the second side surface of the photo mask meet.

Further, the first position determining block may have a first vertical surface contacting the first side surface when the photo mask is aligned in the proper position, and a first inclined surface inclined downward from a lower end of the first vertical surface in an inward direction, and the second position determining block may have a second vertical surface contacting the second side surface when the photo mask is aligned in the proper position, and a second inclined surface inclined downward from a lower end of the second vertical surface in an inward direction.

Further, the push member may include: an actuator; and a push finger moved in the diagonal direction by the actuator and brought into contact with the second corner portion of the photo mask.

Further, the push finger may include a first finger and a second finger which are in contact with the third side surface and the fourth side surface, respectively, and the first finger and the second finger may include an elastic member for shock mitigation when being in contact with the photo mask.

Further, the push member may include: a first air shift nozzle provided to face the third side surface and spraying air toward the third side surface; and a second air shift nozzle provided to face the fourth side surface and spraying air toward the fourth side surface.

Further, the first air shift nozzle and the second air shift nozzle may include spray holes provided along a horizontal direction, the spray holes may be provided so that diameters increase as distances from the second corner increase, and the air may include Clean Dry Air (CDA).

Further, the second guide member may include: a first reverse movement prevention surface for supporting a third bottom corner where a bottom surface and the third side surface of the photo mask meet, and inclined upward in an outward direction away from the photo mask; and a second reverse movement prevention surface for supporting a fourth bottom corner where the bottom surface and the fourth side surface of the photo mask meet, and inclined upward in an outward direction away from the photo mask.

Further, the photo mask stage unit may further include: a third guide member for supporting a third corner portion where the first side surface and the third side surface of the photo mask meet; and a fourth guide member for supporting a fourth corner portion where the second side surface and the fourth side surface of the photo mask meet and positioned diagonally from the third corner portion, in which the third guide member may have a third vertical surface contacting the first side surface when the photo mask is aligned in the proper position, and a third inclined surface inclined downward from a lower end of the third vertical surface in an inward direction, and the fourth guide member may have a fourth vertical surface contacting the second side surface when the photo mask is aligned in the proper position, and a fourth inclined surface inclined downward from a lower end of the fourth vertical surface in an inward direction.

Another aspect of the present invention provides a photo mask stocker, including: a loading unit for receiving a container in which a photo mask is stored and opening the container to expose the photo mask; and an inspection unit connected to the loading unit, and reading information related to the photo mask to obtain information on the photo mask, in which the inspection unit includes: a stage on which the photo mask is seated; and an aligning module for pushing the photo mask in one direction while the photo mask is seated on the stage and aligning the photo mask.

Further, the stage may include: a first guide member for supporting a first corner portion where a first side surface and a second side surface of the photo mask meet; and a second guide member for supporting a second corner portion where a third side surface and a fourth side surface of the photo mask meet and is positioned diagonally from the first corner portion, and the aligning module may include a pushing member for pushing the photo mask in a diagonal direction from the second corner toward the first corner.

Further, the push member may include: an actuator; and a push finger moved in the diagonal direction by the actuator and brought into contact with the second corner portion of the photo mask.

Further, the push finger may include: fingers which are in contact with the third side surface and the fourth side surface, respectively; and an elastic member for mitigating shock when the fingers are in contact with the photo mask.

Further, the push member may shift the photo mask in a non-contact manner by spraying Clean Dry Air (CDA) to the third side surface and the fourth side surface.

Further, the push member may include: a first air shift nozzle provided to face the third side surface and spraying air toward the third side surface; and a second air shift nozzle provided to face the fourth side surface and spraying air toward the fourth side surface, and the first air shift nozzle and the second air shift nozzle include spray holes provided along a horizontal direction, and the spray holes are provided so that diameters increase as distances from the second corner increase.

Further, the first guide member may include: a first position determining block for supporting a first bottom corner where a bottom surface and the first side surface of the photo mask meet; and a second position determining block for supporting a second bottom corner where the bottom surface and the second side surface of the photo mask meet, and each of the first position determining block and the second position determining block may have: a first end inclined upward in an outward direction away from the photo mask; a vertical surface extending in a vertical direction from an outer end of the first end; and a second end inclined upward in an outward direction from an upper end of the vertical surface.

Further, the second guide member may include: a first reverse movement prevention surface for supporting a third bottom corner where a bottom surface and the third side surface of the photo mask meet, and inclined upward in an outward direction away from the photo mask; and a second reverse movement prevention surface for supporting a fourth bottom corner where the bottom surface and the fourth side surface of the photo mask meet, and inclined upward in an outward direction away from the photo mask.

Further, the photo mask stocker may further include: a third guide member for supporting a third corner portion where the first side surface and the third side surface of the photo mask meet; and a fourth guide member for supporting a fourth corner portion where the second side surface and the fourth side surface of the photo mask meet and positioned diagonally from the third corner portion, and each of the third guide member and the fourth guide member may have: a first end inclined upward in an outward direction away from the photo mask; and a vertical surface extending in a vertical direction from an outer end of the first end and provided to face the first side surface.

Still another aspect of the present invention provides a photo mask stocker, including: a loading unit for receiving a container in which a photo mask is stored and opening the container to expose the photo mask; an inspection unit connected to the loading unit, and reading information related to the photo mask to inspect the photo mask, and a storage unit for storing the photo mask that has been inspected by the inspection unit, in which the inspection unit includes: a stage including a first guide member supporting a first corner portion where a first side surface and a second side surface of the photo mask meet, and a second guide member positioned diagonally from the first corner portion and supporting a second corner portion where a third side surface and a fourth side surface of the photo mask meet; a pushing member for pushing the photo mask in a diagonal direction from the second corner toward the first corner in a state in which the photo mask is seated on the first guide member and the second guide member and aligning the photo mask; and a vision module for obtaining information from the photo mask positioned on the stage at a proper position by the push member or inspecting the photo mask.

Further, the push member may include: an actuator; and a push finger moved in the diagonal direction by the actuator and brought into contact with the second corner of the photo mask, and the push finger may include: fingers which are in contact with the third side surface and the fourth side surface, respectively; and an elastic member for mitigating shock when the fingers are in contact with the photo mask.

Further, the push member may include: a first air shift nozzle provided to face the third side surface and spraying clean dry air toward the third side surface; and a second air shift nozzle provided to face the fourth side surface and spraying clean dry air toward the fourth side surface, and the first air shift nozzle and the second air shift nozzle may include spray holes provided along a horizontal direction, and the spray holes may be provided so that diameters increase as distances from the second corner increase.

Further, the first guide member may include: a first position determining block for supporting a first bottom corner where a bottom surface and the first side surface of the photo mask meet; and a second position determining block for supporting a second bottom corner where the bottom surface and the second side surface of the photo mask meet, and each of the first position determining block and the second position determining block may have: a first end inclined upward in an outward direction away from the photo mask; a vertical surface extending in a vertical direction from an outer end of the first end; and a second end inclined upward in an outward direction from an upper end of the vertical surface.

Further, the second guide member may include: a first reverse movement prevention surface for supporting a third bottom corner where a bottom surface and the third side surface of the photo mask meet, and inclined upward in an outward direction away from the photo mask; and a second reverse movement prevention surface for supporting a fourth bottom corner where the bottom surface and the fourth side surface of the photo mask meet, and inclined upward in an outward direction away from the photo mask.

According to the present invention, it is possible to accurately align the photo mask.

According to the present invention, it is possible to prevent contamination and damage to the photo mask by minimizing the contact surface with the photo mask during the process of aligning the photo mask.

The effect of the present invention is not limited to the foregoing effects. Those skilled in the art may clearly understand non-mentioned effects from the present specification and the accompanying drawings.

DETAILED DESCRIPTION

Figure 1:
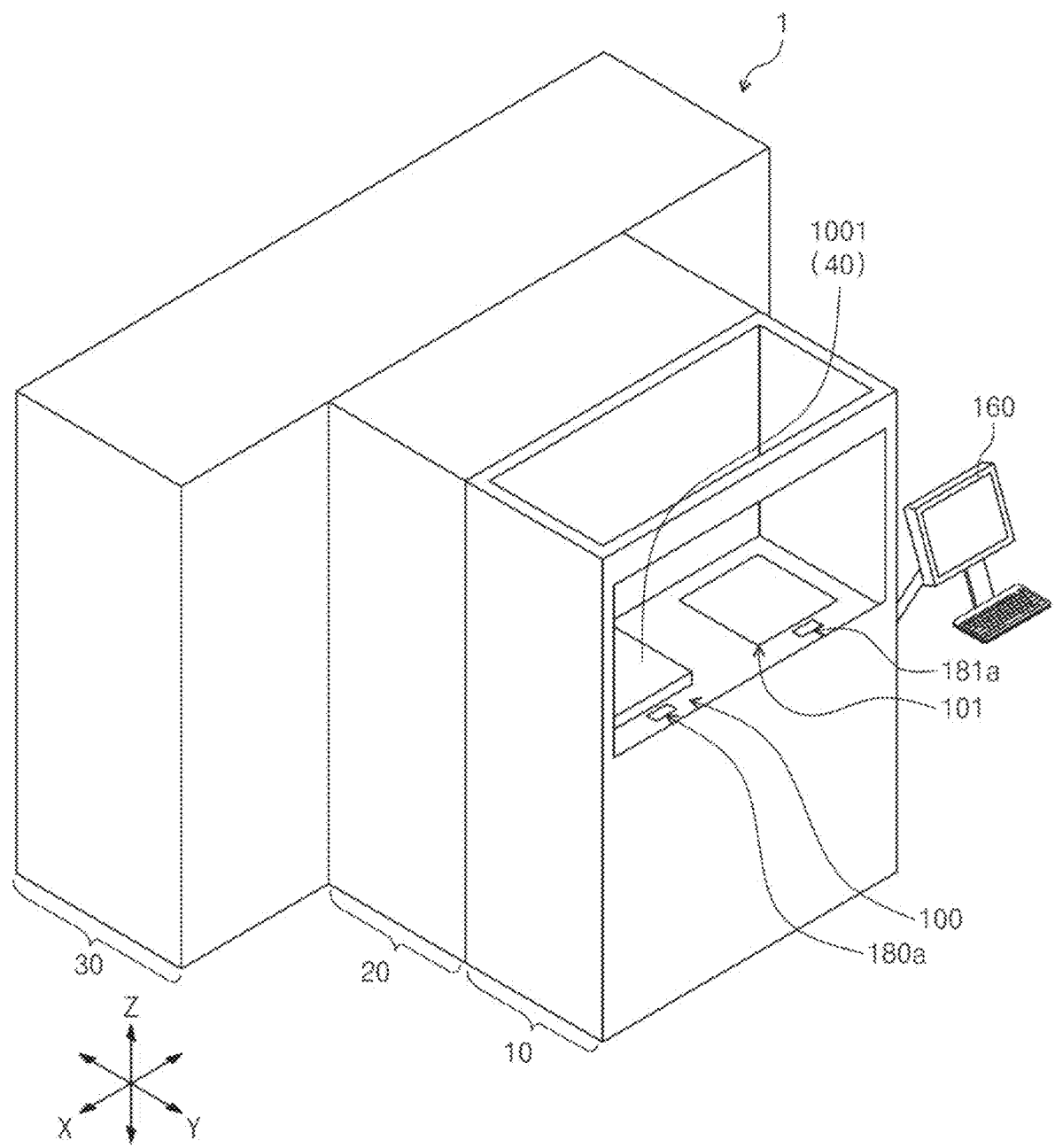
FIG. 1 is an exemplary perspective view of a photo mask stocker according to an exemplary embodiment of the present invention.

Hereinafter, an exemplary embodiment of the present invention will be described more fully hereinafter with reference to the accompanying drawings, in which exemplary embodiments of the invention are illustrated. However, the present invention can be variously implemented and is not limited to the following exemplary embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the word "comprise" and variations, such as "comprises" or "comprising" will be understood to imply the inclusion of stated elements but not the exclusion of any other elements. It will be appreciated that terms "including" and "having" are intended to designate the existence of characteristics, numbers, operations, operations, constituent elements, and components described in the specification or a combination thereof, and do not exclude a possibility of the existence or addition of one or more other characteristics, numbers, operations, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

It should be understood that when one constituent element referred to as being "coupled to" or "connected to" another constituent element, one constituent element can be directly coupled to or connected to the other constituent element, but intervening elements may also be present. In contrast, when one constituent element is "directly coupled to" or "directly connected to" another constituent element, it should be understood that there are no intervening element present. Other expressions describing the relationship between the constituent elements, such as "between ~" and "just between ~" or "adjacent to ~" and "directly adjacent to ~" should be interpreted similarly.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

The foregoing detailed description illustrates the present invention. Further, the above content illustrates and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

In an exemplary embodiment of the present invention, a substrate processing apparatus for etching a substrate by using plasma will be described. However, the present invention is not limited thereto and is applicable to applied to various types of devices that perform a process by supplying plasma into a chamber.

Figure 2:
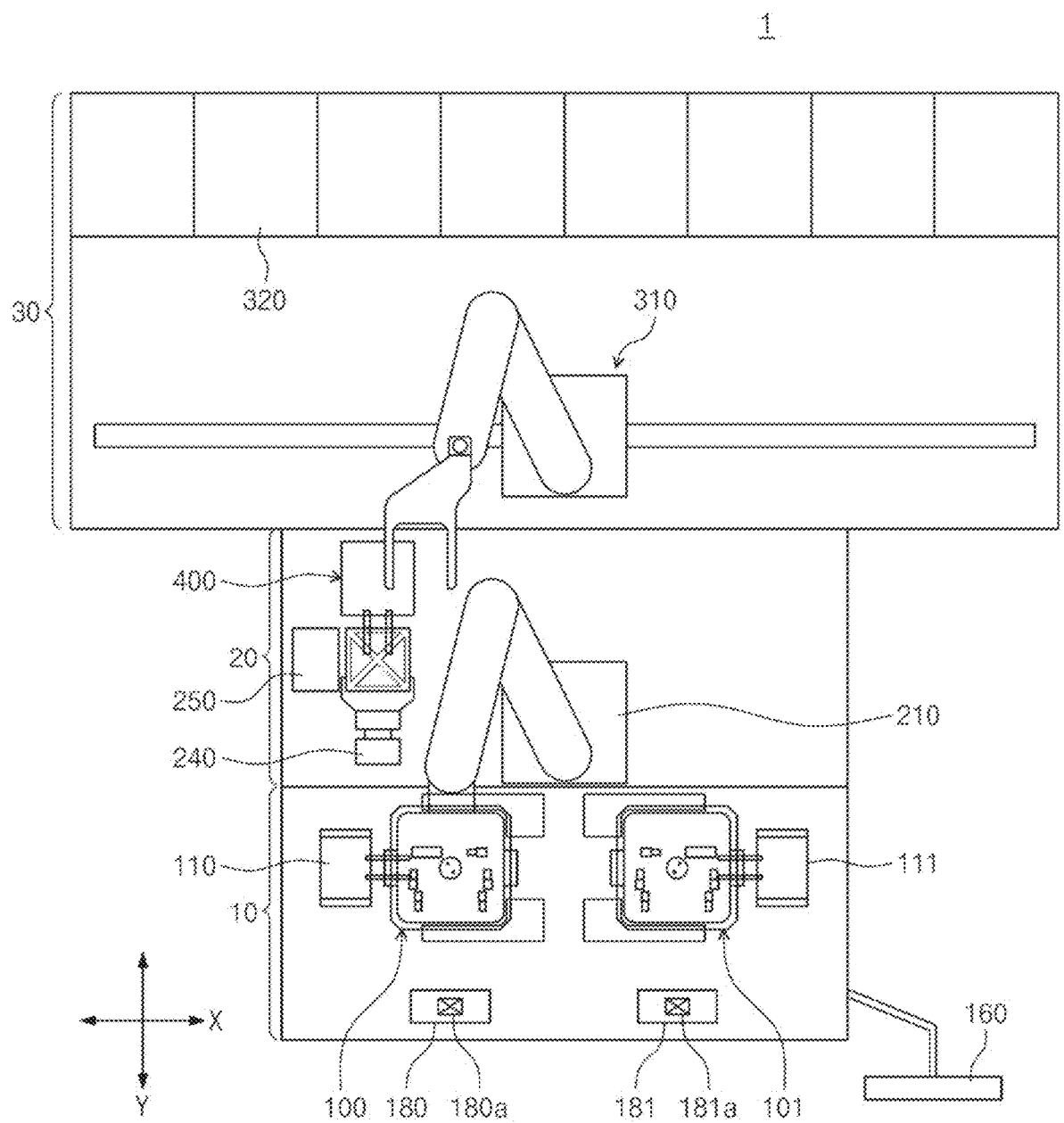
FIG. 2 is an exemplary top plan view of the photo mask stocker according to the exemplary embodiment of the present invention.
Figure 3:
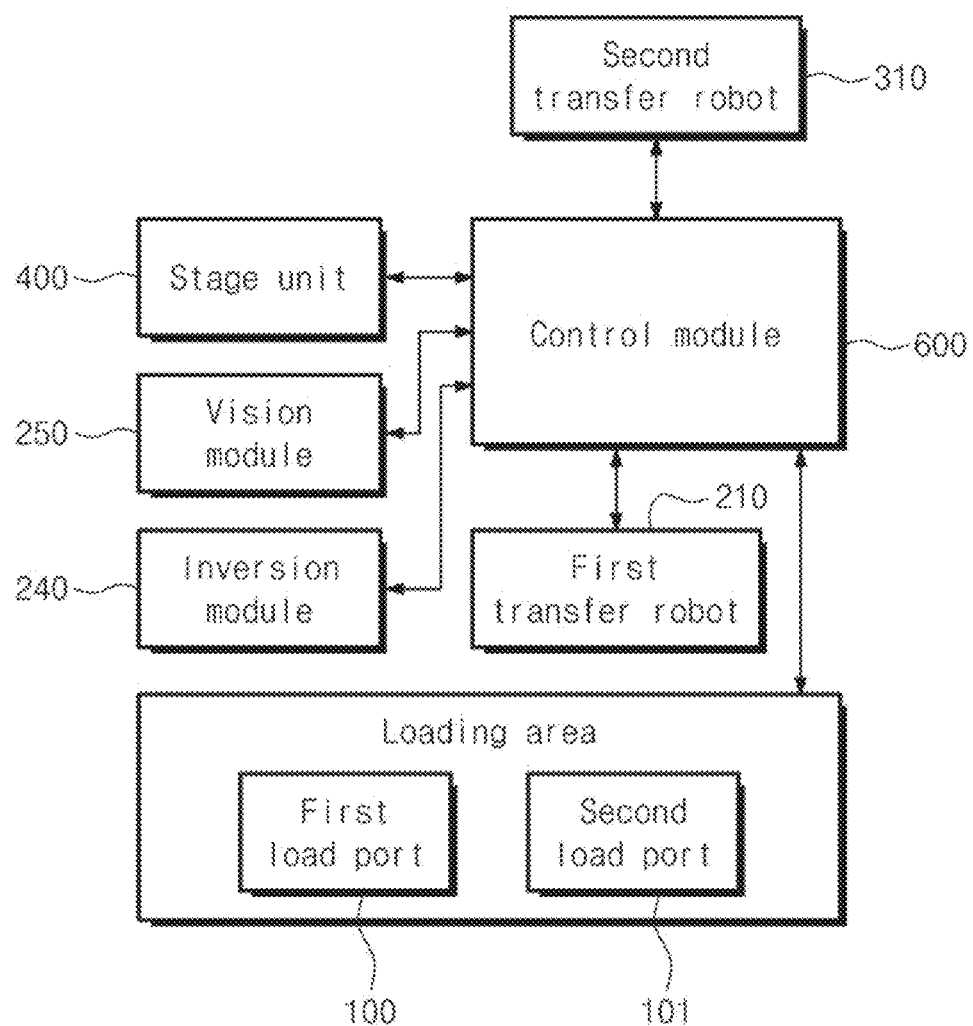
FIG. 3 is an exemplary block diagram of a photo mask stocker according to the exemplary embodiment of the present invention.

FIGS. 1 to 3 are illustrative a perspective view, a top plan view, and a block diagram of a photo mask stocker according to an exemplary embodiment of the present invention.

Referring to FIGS. 1 to 3, a photo mask stocker according to some exemplary embodiments of the present invention includes a loading area 10, an inspection area 20, a storage area 30, a control module 900, and the like.

The loading area 10 is formed to elongate in a first direction X, for example. As illustrated in the drawings, a plurality of load ports 100 and 101 (for example, two load ports) may be disposed in the first direction X in the loading area 10.

The loading area 10 receives the container (or carrier, cassette) 1001 in which a photo mask 40 is stored through the plurality of load ports 100 and 101. Subsequently, the loading area 10 recognizes information included in the container 1001 and reads information related to the container 1001 and/or the photo mask 40. For example, it may be checked whether the container 1001 corresponds to a first type or a second type in the loading area 10. When the type of container 1001 is different, the type of photo mask 40 in the container 1001 may also be different. Here, the loading area 10 may use various types of reading methods to recognize information from a plurality of containers 1001 of different types. Alternatively, one type of read method may be used multiple times.

The container 1001 that can be used may be, for example, a Reticle Standard Mechanical interface Pod (RSP) or a EUV reticle pod. A photo mask stored in the RSP (that is, the RSP photo mask) and a photo mask stored in the EUV reticle pod (that is, the EUV photo mask) may be different from each other.

After recognizing information related to the container 1001 and/or the photo mask 40 through the above-described read operation, the loading area 10 may open the containers 1001 in a different order according to the recognized information. The container 1001 may be moved in the third direction Z (that is, up and down) by lifting units 110 and 111. As the container 1001 is moved in the down direction by the lifting units 110 and 111, an opening process of the container 1001 may be performed. When the container 1001 is opened, the photo mask 40 inside is exposed. For example, when the container 1001 is the first type, the container 1001 may be opened according to a first order, and when the container 1001 is the second type, the container 1001 may be opened according to a second order different from the first order.

The loading area 10, the inspection area 20, and the storage area 30 may be disposed to be in contact with each other in the second direction Y. For example, the inspection area 20 may be formed to elongate in the first direction X.

The inspection area 20 may include a first transfer robot 210, an aligner (or rotator) 400, an inversion module 240 and a vision module 250. Here, the first transfer robot 210, the stage unit 400, the inversion module 240, and the vision module 250 may be used regardless of the type of photo mask 40.

The first transfer robot 210 may grip the photo mask 40 and transfer the photo mask 40 from the loading area 10 to the inside of the inspection area 20, or conversely, transfer the photo mask 40 from the inspection area 20 to the loading area 10. Alternatively, the first transfer robot 210 may be used to transfer the photo mask 40 within the inspection area 20. The first transfer robot 210 includes a plurality of links to be capable of individually rotating for each link. Therefore, within the allowed reach range, the first transfer robot 210 is capable of moving in all directions and may be controlled in multiple angles.

The stage unit 400 receives the photo mask 40 from the first transfer robot 210 and aligns the photo mask in place.

For example, since the photo mask 40 is not stored in place in the container 1001, the stage unit 400 may receive the photo mask 40 in a misaligned state. In this case, the stage unit 400 performs an alignment operation so that the photo mask 40 is properly positioned. The stage unit 400 will be described in detail with reference to FIGS. 4A to 12.

The inversion module 240 inverts the photo mask 40. That is, the inversion module 240 inverts the photo mask 40 with its back side facing up, and make the photo mask 40 be turned face up. The inversion module 240 may hold the photo mask 40 in an air chuck method.

The vision module 250 photographs the photo mask 40 to obtain information from the photo mask 40 or inspect the photo mask 40. For example, the vision module 250 may check the type of photo mask 40 or inspect the position (direction) of the photo mask 40.

Specifically, when the photo mask 40 is seated on the stage unit 400, the vision module 250 photographs the photo mask 40 and the control module 900 may obtain photo mask-related information (that is, identification information) from the photographed images (including still pictures and moving pictures). The identification information may be, for example, a tracking number, type classification, and lithography tool classification. This identification information is displayed on the photo mask 40 itself in a machine readable form. Here, the machine-readable type may be a barcode or OCR. For example, the control module 900 recognizes a barcode, an align mark, and the like of the RSP photo mask from an image of the RSP photo mask. Also, the control module 900 may recognize common shading of the EUV photo mask from an image obtained by photographing the EUV photo mask.

Information related to the photo mask 40 is stored in the control module 900 or in a memory connected to the control module 900. In the memory, for example, the photo mask 40 is divided into 36 types, and characteristics for the respective types are stored. Accordingly, the control module 900 may obtain information from a photographed image of the photo mask and compare the obtained information with the information stored in the memory to determine the type of photo mask. The type of photo mask 40 determined in this way may be a photo mask equipped with a pellicle frame.

Also, the control module 900 controls the loading area 10, the inspection area 20, and the storage area 30. This control module 900 may also be installed inside the inspection area 20. In addition, the control module 900 may be connected to the control server wirelessly or wired. The control server is a higher level system that has information about the entire process for facility automation. Accordingly, the control server may issue an operation command to the control module 900 based on this information.

The photo mask stocker may operate in various modes of operation. For example, the various modes of operation may be an auto mode, a semi-auto mode, and a manual mode. For example, in the auto mode, the control module 900 may receive instructions from the control server and control the loading area 10, inspection area 20, and storage area 30 according to the instructions. Also, in the manual mode, the control module 900 may receive instructions directly from an operator. That is, the operator can give specific instructions through the control panel. As illustrated, the shape of the control panel 160 may be a shape of the display panel installed on one side of the photo mask stocker 1, but is not limited thereto. For example, the control panel 160 may be separated from the photo mask processing device and may also be connected to the control module 600 through wired or wireless communication.

The storage area 30 may include shelves 320 for storing photo masks 40 processed in the inspection area 20 and a second transfer robot 310 for transferring the photo masks 40. The second transfer robot 310 transfers the photo mask 40 between the stage unit 400 and the shelves 320. The second transfer robot 310 has the same structure as the first transfer robot 210, and a detailed description thereof will be omitted.

Figure 4A:
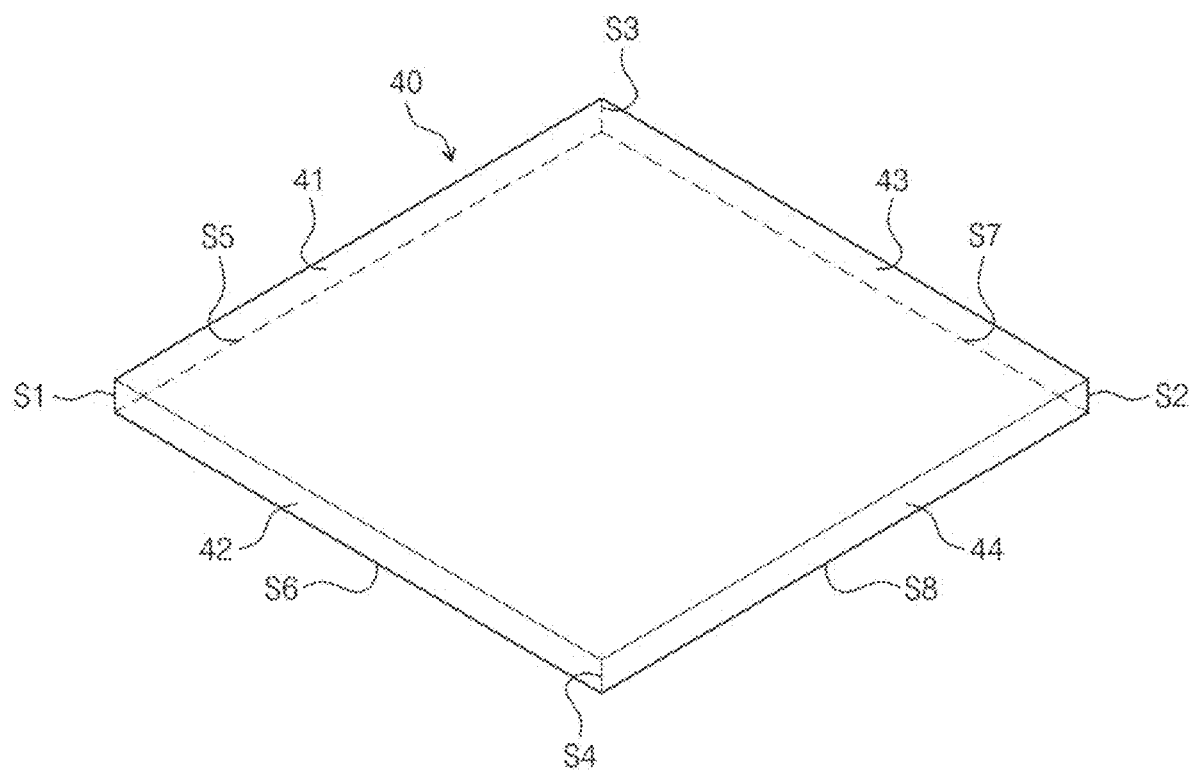
FIG. 4A is a perspective view illustrating a photo mask.
Figure 4B:
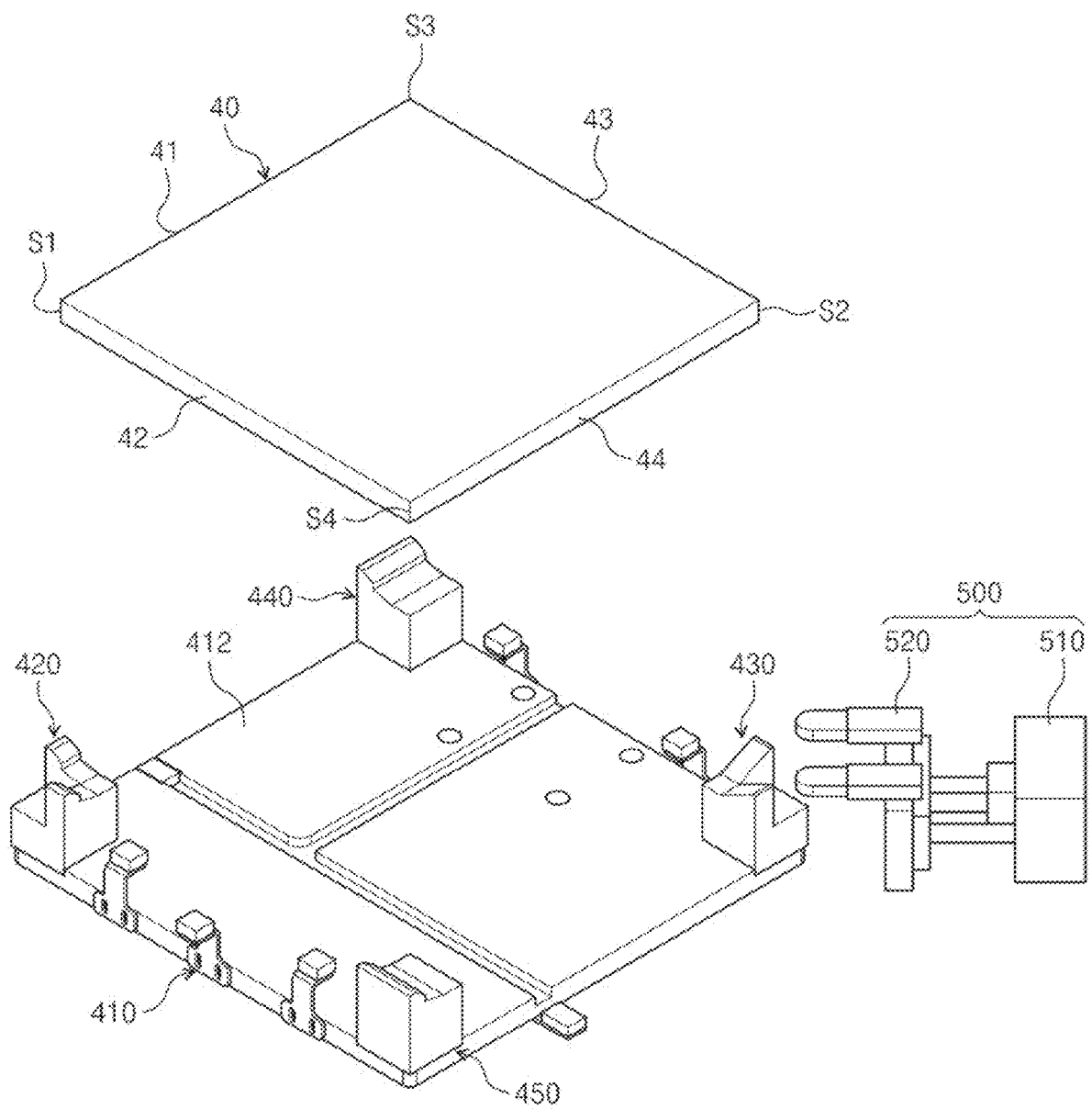
FIG. 4B is a perspective view illustrating a stage unit.
Figure 5:
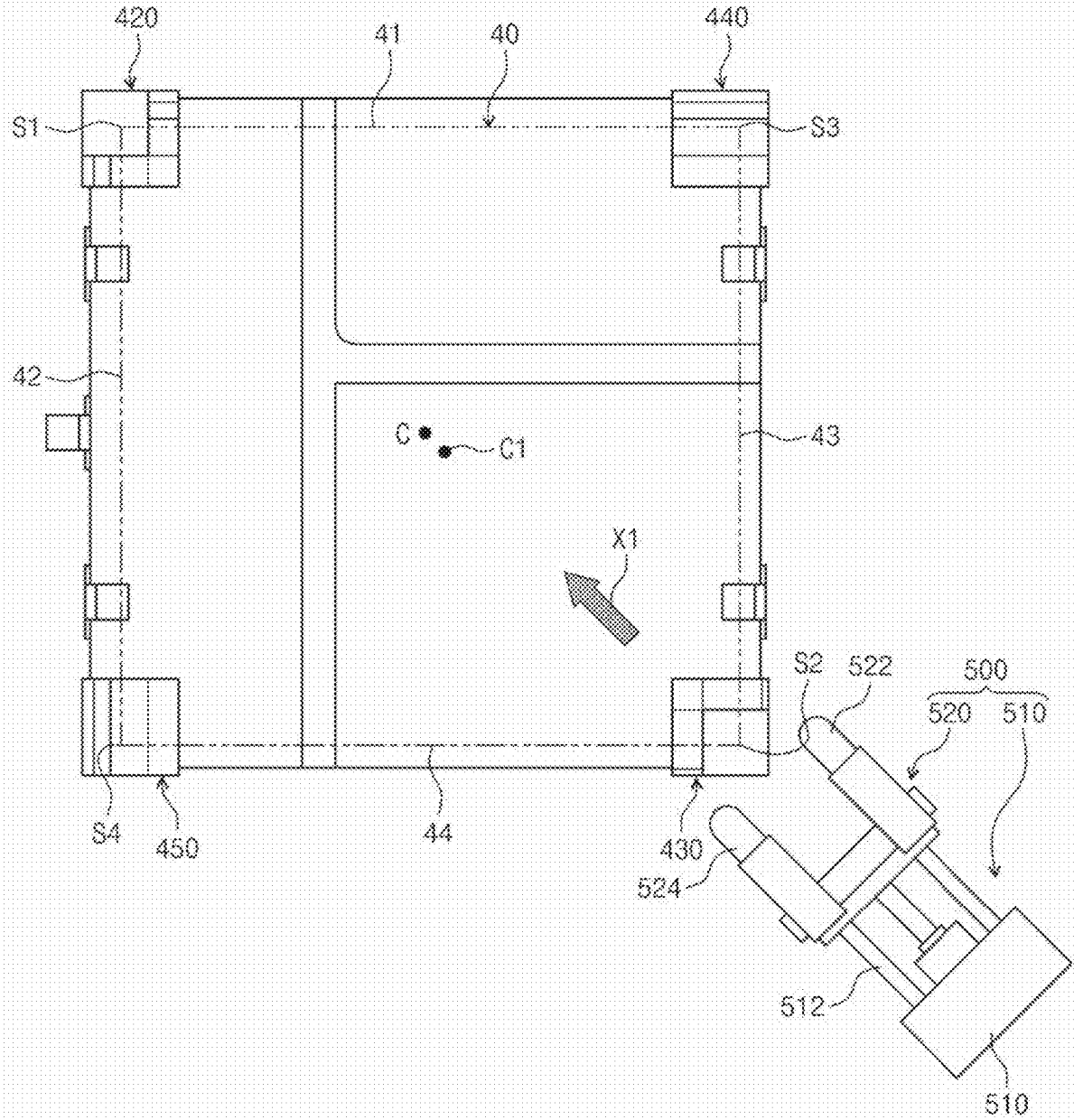
FIG. 5 is a top plan view of the stage unit illustrated in FIG. 4B.
Figure 6:
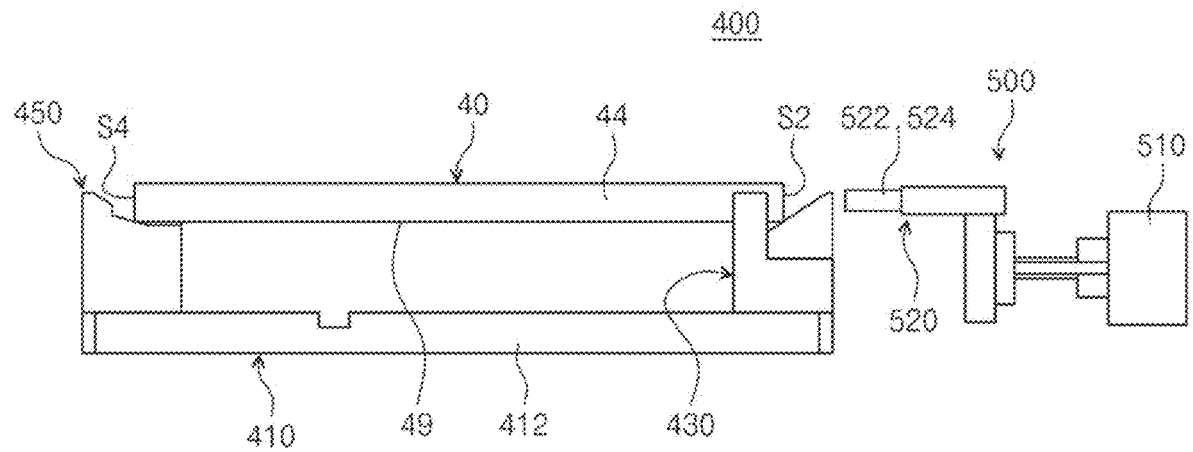
FIG. 6 is a side view of the stage unit illustrated in FIG. 4B.
Figure 7A:
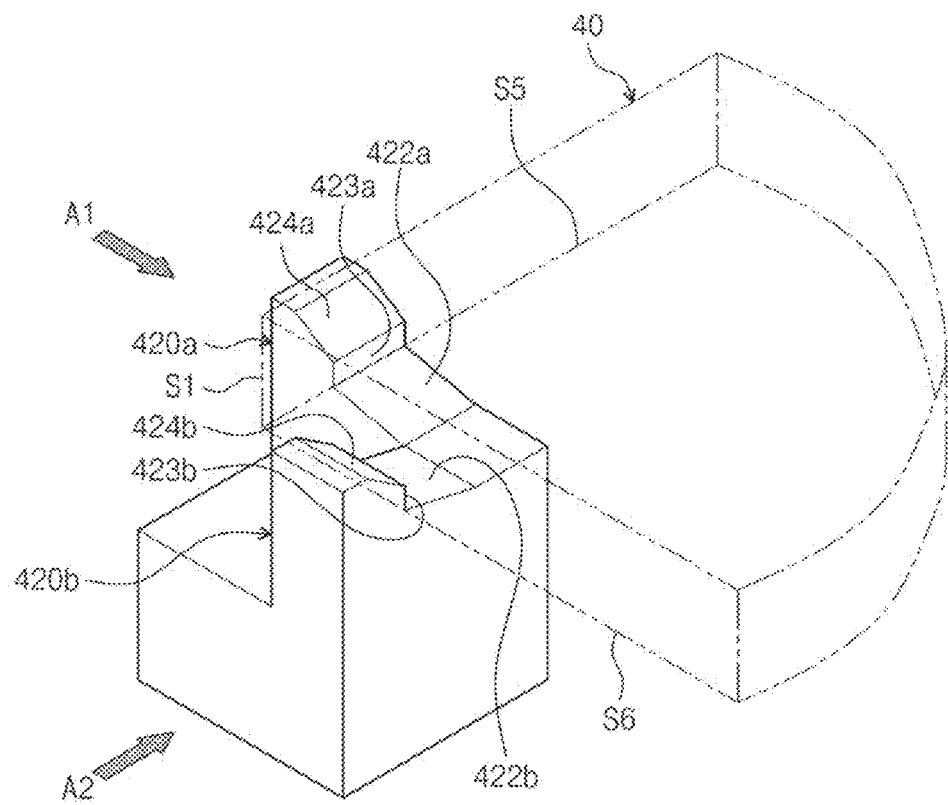
FIG. 7A is a perspective view illustrating a first guide member.
Figure 7B:
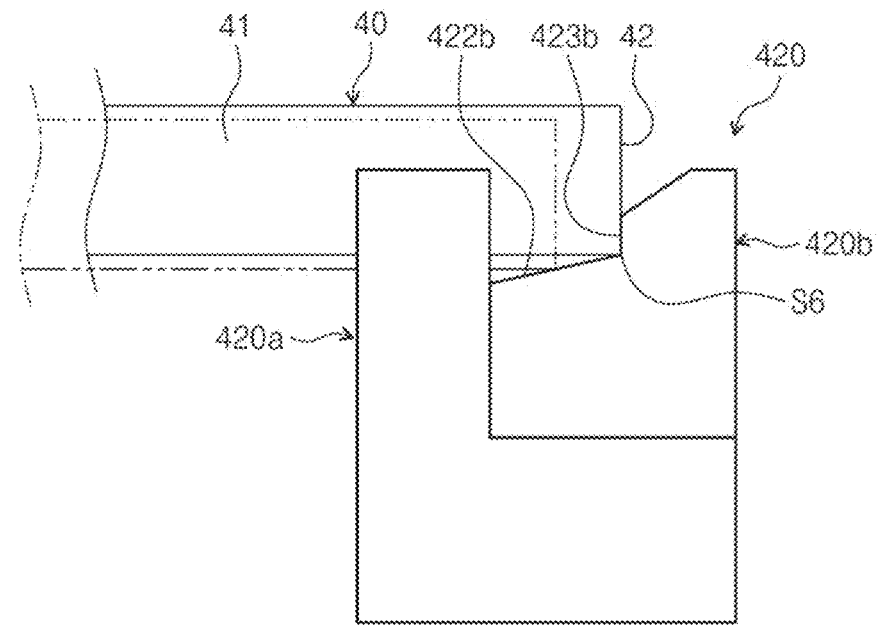
FIG. 7B is a side view of the first guide member viewed from the direction A1 illustrated in FIG. 7A.
Figure 7C:
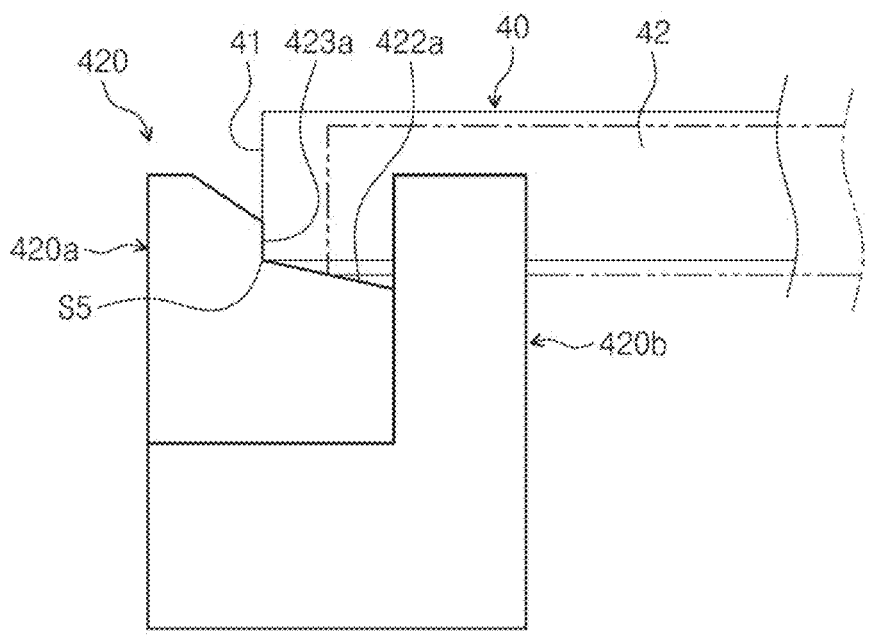
FIG. 7C is a side view of the first guide member viewed from the direction A2 illustrated in FIG. 7A.
Figure 8:
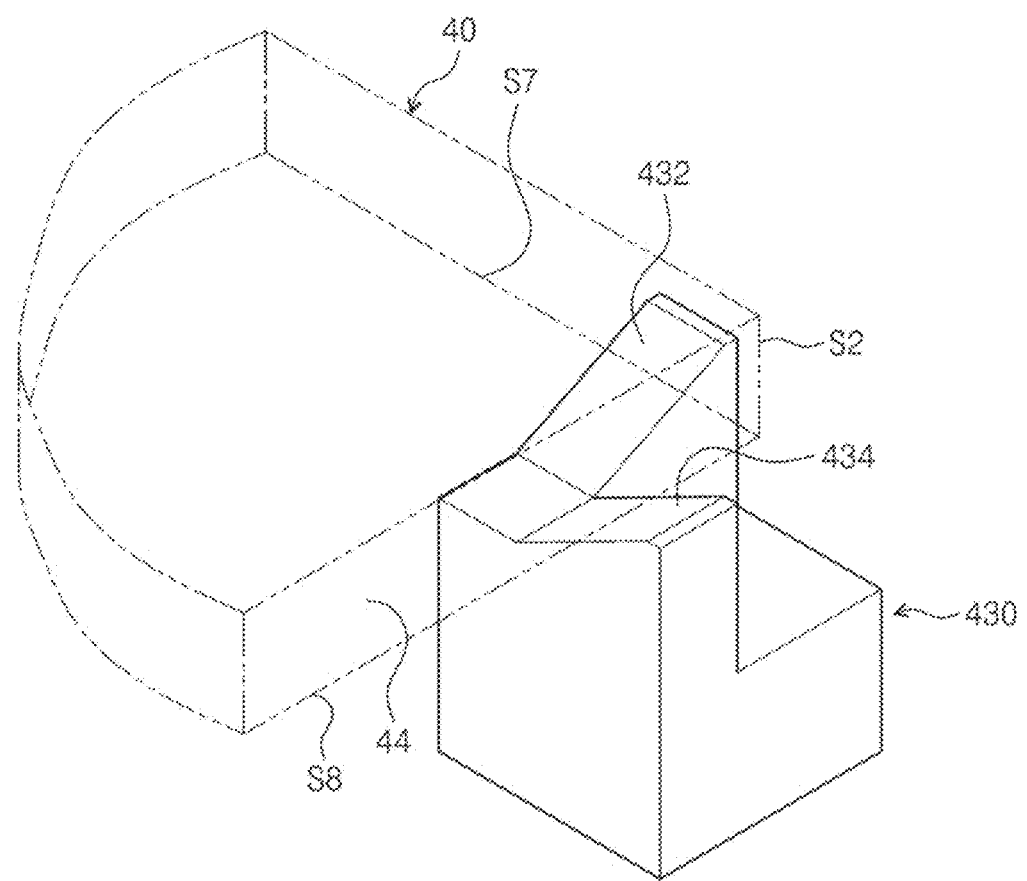
FIG. 8 is a diagram for describing a second guide member.
Figure 9:
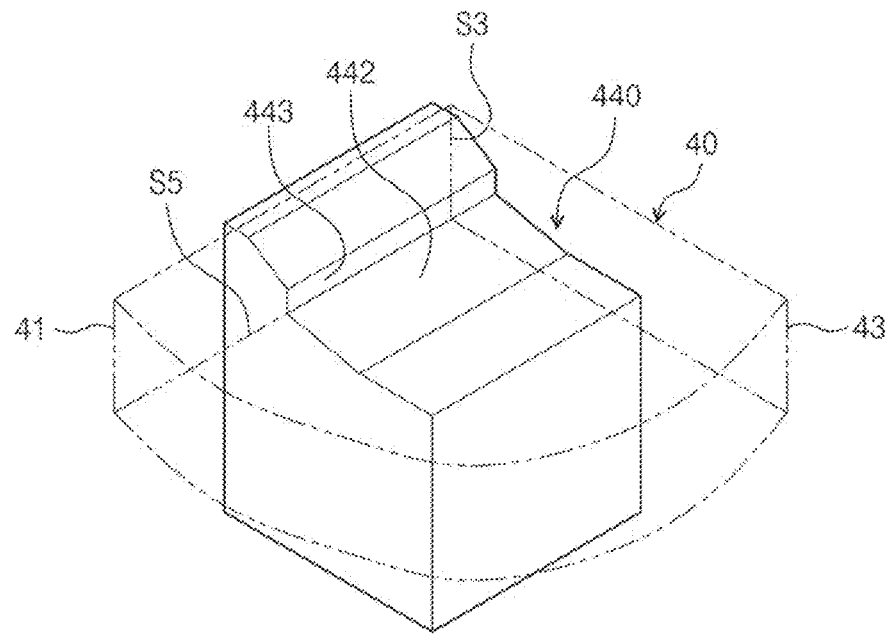
FIG. 9 is a diagram for describing a third guide member.
Figure 10:
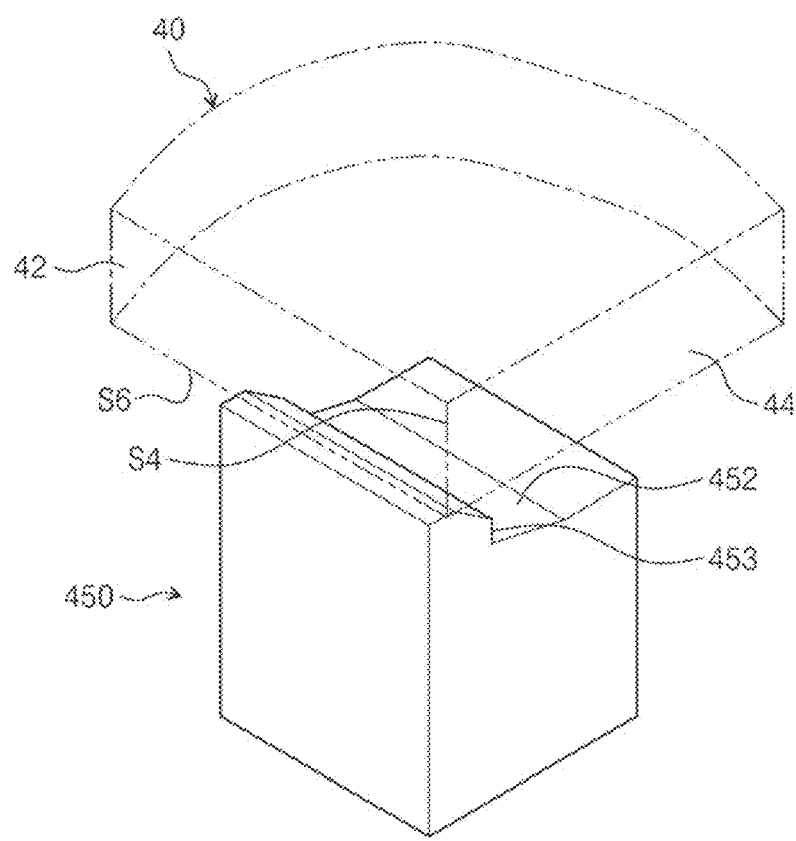
FIG. 10 is a diagram for describing a fourth guide member.

FIG. 4A is a perspective view illustrating the photo mask, and FIG. 4B is a perspective view illustrating the stage unit. FIG. 5 is a top plan view of the stage unit illustrated in FIG. 4B, and FIG. 6 is a side view of the stage unit illustrated in FIG. 4B. FIGS. 7A to 7C are diagrams illustrating a first guide member, FIG. 8 is a diagram for describing a second guide member, and FIGS. 9 and 10 are diagrams for describing a third guide member and a fourth guide member.

In FIG. 4A, reference numeral 51 denotes a first corner where a first side surface 41 and a second side surface 42 meet, reference numeral S2 denotes a second corner where a third side surface 43 and a fourth side surface 44 meet, reference numeral S3 denotes a third corner where the first side surface 41 and the third side surface 43 meet, and reference numeral S4 denotes a fourth corner where the second side surface 42 and the fourth side surface 44 meet. Further, reference numeral S5 denotes a first bottom corner where the first side surface 41 and a bottom surface 49 meet, reference numeral S6 denotes a second bottom corner where the second side surface 42 and the bottom surface 49 meet, reference numeral S7 denotes a third bottom corner where the third side surface 43 and the bottom surface 49 meet, and reference numeral S8 denotes a fourth bottom corner where the fourth side surface 44 and the bottom surface 49 meet.

Referring to FIGS. 4A to 6, the stage unit 400 may include a stage 410 and an aligning member 500.

For example, the photo mask 40 may be loaded by the first transfer robot 210 from a proper position C1 on the stage 410 to a first position C1 spaced apart by a predetermined interval. The first position C1 may be a diagonal direction in which a second guide member 430 is positioned from the proper position C1. Meanwhile, the photo mask for which vision inspection has been completed in the stage unit is unloaded by the second transfer robot 310.

The stage 410 may include a base plate 412 and first to fourth guide members 420 to 450.

The base plate 412 has a larger diameter than the photo mask 40. First to fourth guide members 420 to 450 are positioned at corners of the base plate 412. A plurality of sensors is installed on the base plate 412. The sensors may be sensors that detect the existence and alignment state of the photo mask 40 seated on the stage 410.

The first guide member 420 may be installed on the base plate 412 to support a portion of the first corner 51 where the first side surface 41 and the second side surface 42 of the photo mask 40 meet.

FIG. 7A is a perspective view illustrating the first guide member, FIG. 7B is a side view of the first guide member viewed from the direction A1 illustrated in FIG. 7A, and FIG. 7C is a side view of the first guide member viewed from the direction A2 illustrated in FIG. 7A.

Referring to FIGS. 7A to 7C, the first guide member 420 may include a first position determining block 420a and a second position determining block 420b.

The first position determining block 420a supports a first bottom corner S5 where the bottom surface 49 and the first side surface 41 of the photo mask 40 meet. The first position determining block 420a may include a first vertical surface 423a contacting the first side surface 41 when the photo mask 40 is aligned at the proper position, a first inclined surface 422a inclined downward in an inward direction from a lower end of the first vertical surface 423a, and an inclined surface 424a inclined upward in an outward direction from an upper end of the first vertical surface.

The second position determining block 420b supports a second bottom corner S6 where the bottom surface 49 and the second side surface 42 of the photo mask 40 meet. The second position determining block 420b may include a first vertical surface 423b contacting the second side surface 42 when the photo mask 40 is aligned at the proper position, a first inclined surface 422b inclined downward in an inward direction from the lower end of the first vertical surface 423b, and an inclined surface 424b inclined upward in an outward direction from an upper end of the first vertical surface.

When the photo mask 40 is loaded on the stage 410, the first bottom corner S5 is supported on the first inclined surface 422a, and the second bottom corner S6 is supported on the second inclined surface 422b. Then, when the photo mask 40 is aligned by the aligning member 500, the first side surface 41 comes into contact with the first vertical surface 423a and the second side surface 42 comes into contact with the second vertical surface 423b. The dotted lines in the drawings indicate the photo mask before alignment.

FIG. 8 is a perspective view illustrating the second guide member.

Referring to FIGS. 4A to 8, the second guide member 430 may be installed in the base plate 412 to support the second corner S2 where the third side surface 43 and the fourth side surface 44 of the photo mask 40 meet.

The second guide member 430 may include a first reverse movement prevention surface 432 and a second reverse movement prevention surface 434. The first reverse movement prevention surface 432 is inclined to support the third bottom corner S7 of the photo mask 40. For example, the first reverse movement prevention surface 432 is provided with an upward inclination in an outward direction away from the photo mask. The second reverse movement prevention surface 434 is inclined to support the fourth bottom corner S8 of the photo mask 40. The second reverse movement prevention surface 434 is inclined upward in an outward direction away from the photo mask.

The first reverse movement prevention surface 432 and the second reverse movement prevention surface 434 have inclined surfaces in the reverse (uphill) shape in order to prevent the photo mask 40 from being returned after being aligned in the proper position by the aligning member 500.

FIG. 9 is a diagram for describing the third guide member. The third guide member 440 may be installed in the base plate 412 to support a portion of the third corner S3 where the first side surface 41 and the third side surface 43 of the photo mask 40 meet.

The third guide member 440 includes a third vertical surface 443 contacting the first side surface when the photo mask is aligned at the proper position, and a third inclined surface 442 inclined downward from the lower end of the third vertical surface 443 in an inward direction.

When the photo mask 40 is loaded on the stage 410, the third bottom corner S5 is supported on the third inclined surface 442a. Then, when the photo mask 40 is aligned by the aligning member 500, the first side surface 41 comes into contact with the third vertical surface 443.

FIG. 10 is a perspective illustrating the fourth guide member.

The fourth guide member 450 may be installed on the base plate 412 to support a portion of the fourth corner S4 where the second side surface 41 and the fourth side surface 44 of the photo mask 40 meet.

The fourth guide member 450 includes a fourth vertical surface 453 contacting the second side surface 42 when the photo mask is aligned at the proper position, and a fourth inclined surface 452 inclined downward from the lower end of the fourth vertical surface 453 in an inward direction.

When the photo mask 40 is loaded on the stage 410, the second bottom corner S6 is supported on the fourth inclined surface 452. Then, when the photo mask 40 is aligned by the aligning member 500, the second side surface 42 comes into contact with the fourth vertical surface 453.

As described above, the contact area of the photo mask 40 seated on the first to fourth guide members 420 to 450 is minimized by line contact rather than face-to-face contact, and since the bottom surface of the photo mask 40 does not contact the first to fourth guide members 420 to 450, contamination and damage to the bottom surface of the photo mask may be prevented.

Figure 11:
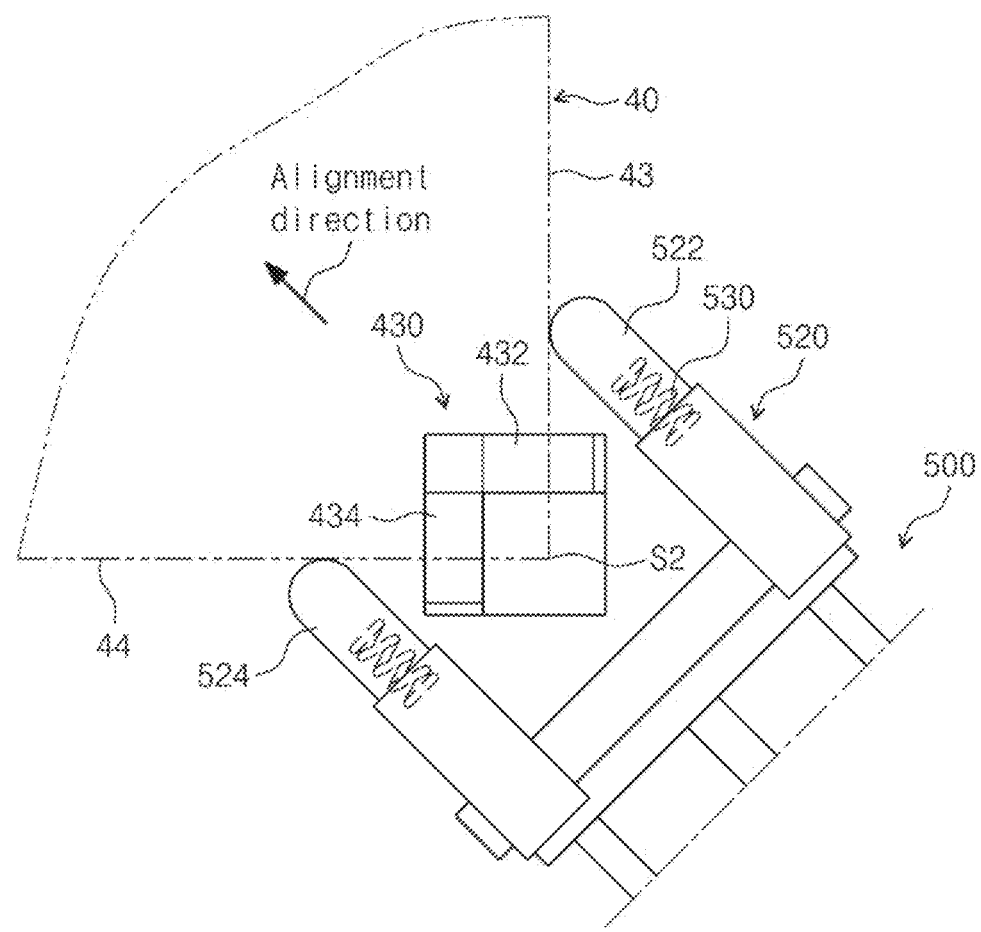
FIG. 11 is a diagram for explaining an aligning member.
Figure 12:
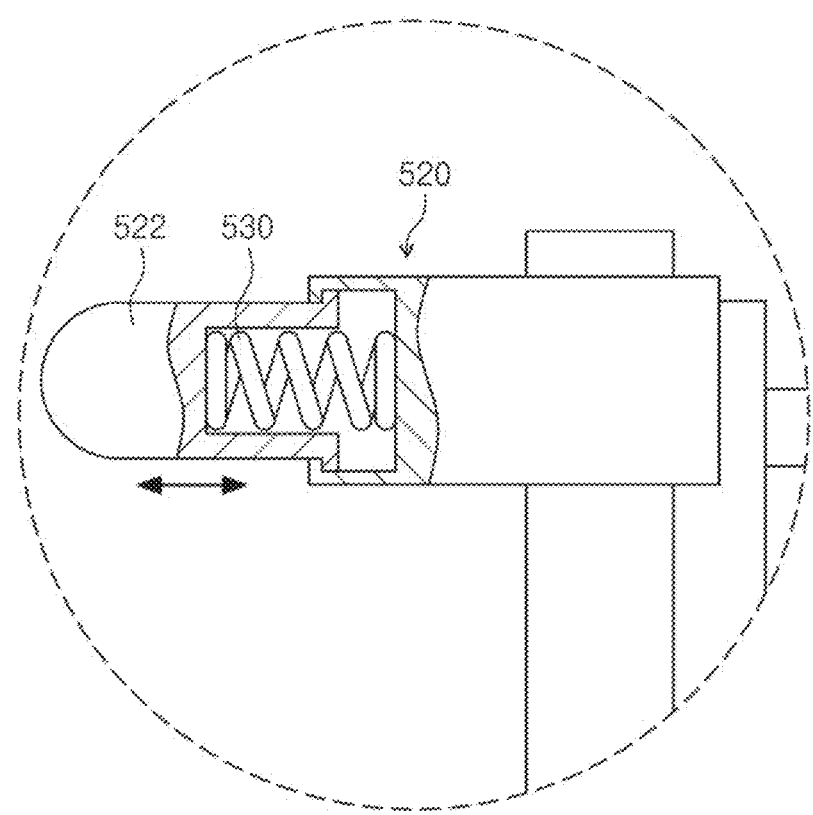
FIG. 12 is an enlarged view of a main part for describing a push finger.

FIG. 11 is a diagram for explaining the aligning member, and FIG. 12 is an enlarged view of a main part for describing a push finger.

Referring to FIGS. 11 and 12, the aligning member 500 (hereinafter referred to as a push member) pushes the photo mask 40 in a diagonal direction (alignment direction) from the second corner S2 toward the first corner S1. The push member 500 may include an actuator 510 and a push finger 520. The push finger 520 may be moved along the guide 512 in a diagonal direction by the actuator 510. The push finger 520 is in contact with the second corner S2 of the photo mask 40. The push finger 520 may include a first finger 522 and a second finger 524. When the push finger 520 moves forward in the alignment direction by the actuator 510, the first finger 522 is in contact with the third side surface 43 and the second finger 524 is in contact with the fourth side surface 44. The first finger 522 and the second finger 524 include an elastic member 530 for shock mitigation upon being in contact with the photo mask 40. The photo mask 40 placed on the stage 410 may be moved in an alignment direction by the push member 500.

Figure 13:
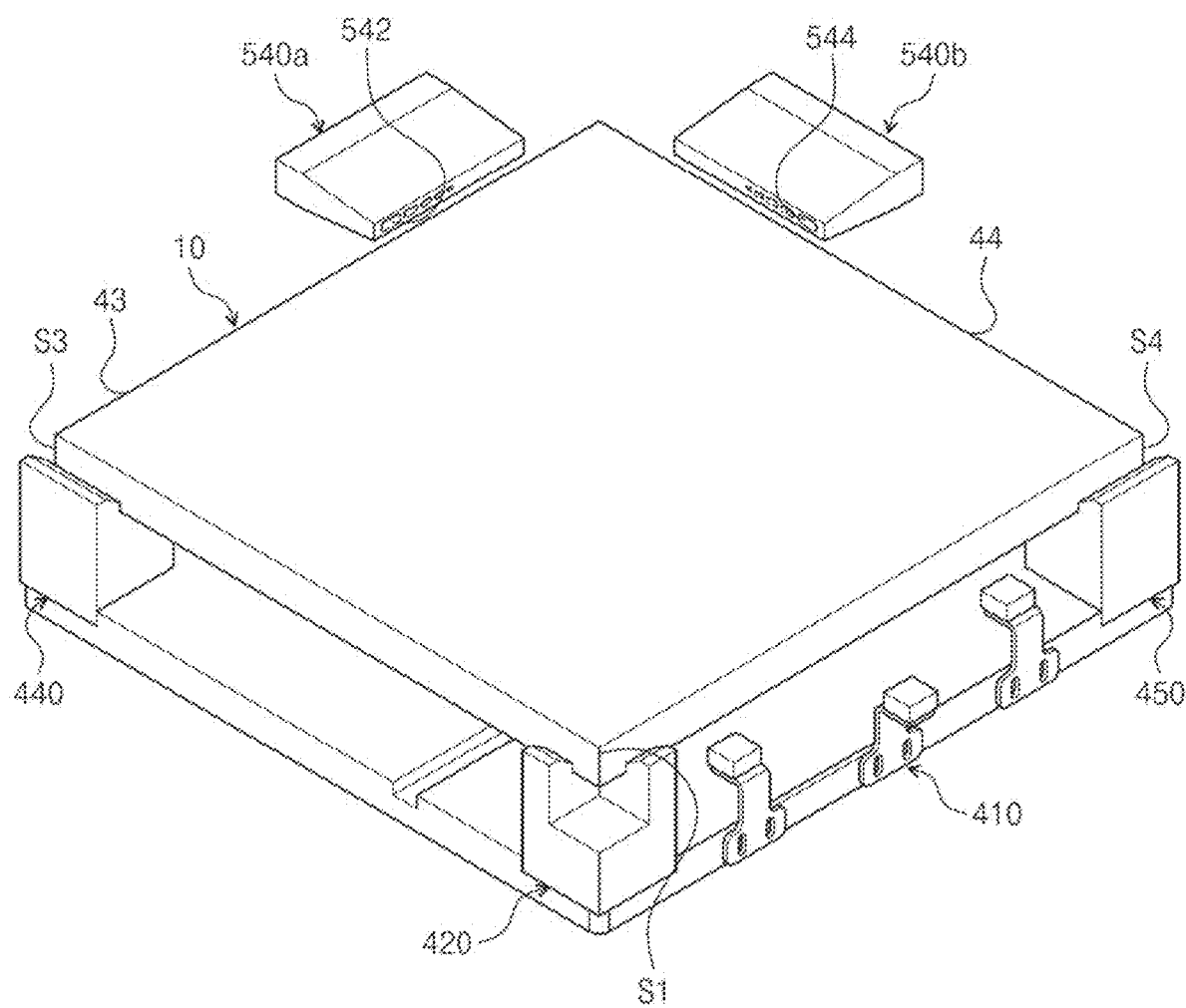
FIGS. 13 and 14 are diagrams illustrating other examples of the aligning member.
Figure 14:
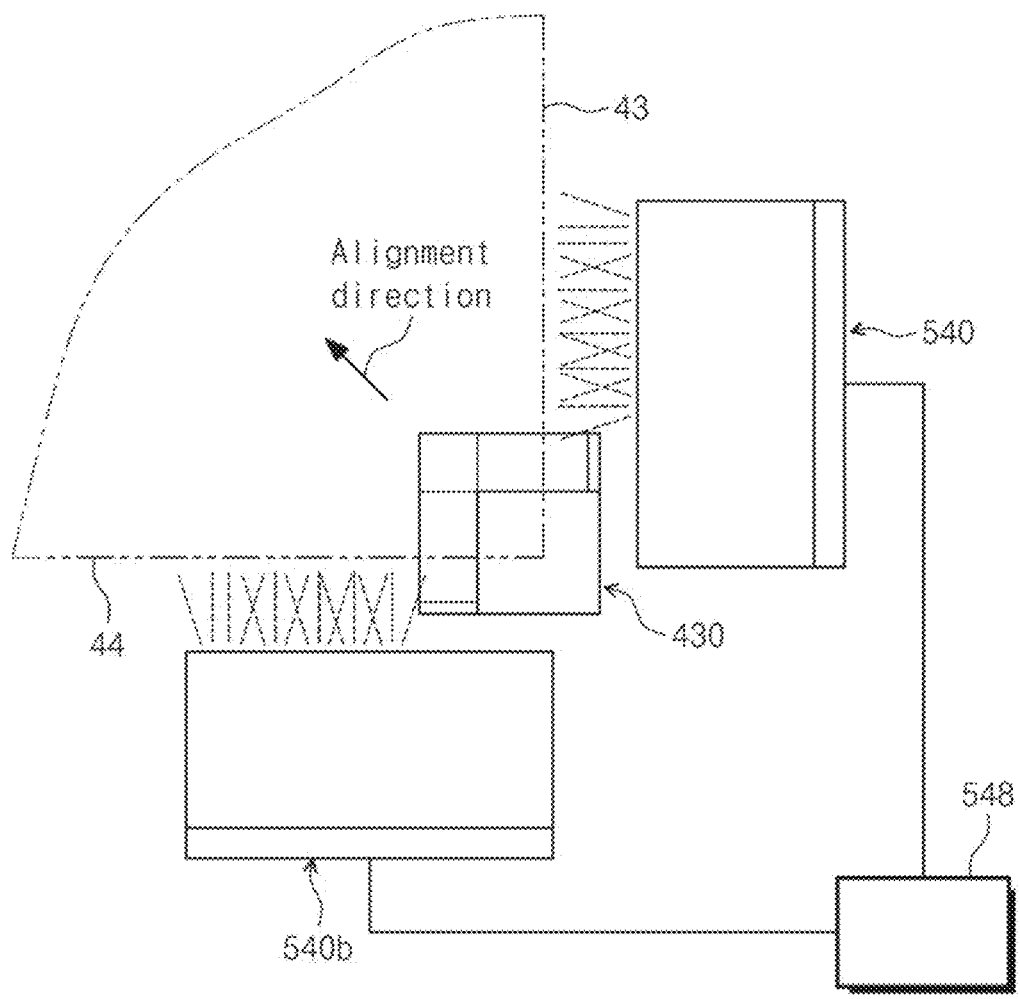

FIGS. 13 and 14 are diagrams illustrating other examples of the aligning member.

Referring to FIGS. 13 and 14, the push member 500a aligns the photo mask 40 in the alignment direction in a non-contact manner by spraying Clean Dried Air (CDA) to the third and fourth side surfaces. The antistatic treatment effect of the photo mask may be expected by the clean dry air supplied from the push member.

For example, the push member 500a may include a first air shift nozzle 540a, a second air shift nozzle 540b, and an air supply unit 548 for supplying high-pressure clean dry air to the first air shift nozzle 540a and the second air shift nozzle 540b. The first air shift nozzle 540a is provided to face the third side surface 43 and has spray holes 542 for spraying air toward the third side surface 43. A plurality of spray holes 542 may be provided along the longitudinal direction of the third side surface 43.

The second air shift nozzle 540b is provided to face the fourth side surface 44 and has spray holes 544 for spraying air toward the fourth side surface 44. A plurality of spray holes 544 may be provided along the longitudinal direction of the fourth side surface 44.

The spray holes 542 of the first air shift nozzle 540a and the spray holes 544 of the second air shift nozzle 540b may have diameters that increase as the distances from the second corner S2 increase. Such an expanded spray hole structure may provide smooth movement of the photo mask in a diagonal direction.

Since not all of the constituent elements or constituent steps are essential in the exemplary embodiments described in this specification, the present invention may selectively include some of the constituent components or constituent steps. Also, the constituent steps do not necessarily have to be performed in the order described, so it is possible for a later described step to be performed prior to an earlier described step.

Furthermore, the above-described exemplary embodiments are not necessarily performed independently, and may be used individually or in combination with each other.

What is claimed is:

1. A photo mask stage unit performing alignment on a photo mask, the photo mask stage unit comprising:
    an aligning member for aligning the photo mask so that the photo mask is positioned in a proper position; and
    guide members for supporting edges of the photo mask and guiding the photo mask to the proper position,
    wherein the aligning member pushes the photo mask in a diagonal direction and
    wherein the guide members include,
    a first guide member for supporting a first corner portion where a first side surface and a second side surface of the photo mask meet, and
    a second guide member positioned diagonally from the first corner portion and supporting a second corner portion where a third side surface and a fourth side surface of the photo mask meet, the second guide member including a first reverse movement prevention surface for supporting a third bottom corner where a bottom surface and the third side surface of the photo mask meet, and inclined upward in an outward direction away from the photo mask, the first reverse movement prevention surface inclined upward in an outward direction extending to a top surface of the second guide member.

2. The photo mask stage unit of claim 1, wherein the aligning member pushes the photo mask in a diagonal direction from the second corner portion toward the first corner portion.

3. The photo mask stage unit of claim 2, wherein the first guide member includes:
    a first position determining block for supporting a first bottom corner where a bottom surface and the first side surface of the photo mask meet; and
    a second position determining block for supporting a second bottom corner where the bottom surface and the second side surface of the photo mask meet.

4. The photo mask stage unit of claim 3, wherein the first position determining block has a first vertical surface contacting the first side surface when the photo mask is aligned in the proper position, and a first inclined surface inclined downward from a lower end of the first vertical surface in an inward direction, and
    the second position determining block has a second vertical surface contacting the second side surface when the photo mask is aligned in the proper position, and a second inclined surface inclined downward from a lower end of the second vertical surface in an inward direction.

5. The photo mask stage unit of claim 2, wherein the push member includes:
    an actuator; and
    a push finger moved in the diagonal direction by the actuator and brought into contact with the second corner portion of the photo mask.

6. The photo mask stage unit of claim 5, wherein the push finger includes a first finger and a second finger which are in contact with the third side surface and the fourth side surface, respectively, and the first finger and the second finger include an elastic member for shock mitigation when being in contact with the photo mask.

7. The photo mask stage unit of claim 2, wherein the push member includes:
a first air shift nozzle provided to face the third side surface and spraying air toward the third side surface; and
a second air shift nozzle provided to face the fourth side surface and spraying air toward the fourth side surface.

8. The photo mask stage unit of claim 7, wherein the first air shift nozzle and the second air shift nozzle include spray holes provided along a horizontal direction,
the spray holes are provided so that diameters increase as distances from the second corner portion increase, and
the air includes Clean Dry Air (CDA).

9. The photo mask stage unit of claim 2, wherein the second guide member further includes:
a second reverse movement prevention surface for supporting a fourth bottom corner where the bottom surface and the fourth side surface of the photo mask meet, and inclined upward in an outward direction away from the photo mask.

10. The photo mask stage unit of claim 2, further comprising:
a third guide member for supporting a third corner portion where the first side surface and the third side surface of the photo mask meet; and
a fourth guide member for supporting a fourth corner portion where the second side surface and the fourth side surface of the photo mask meet and positioned diagonally from the third corner portion,
wherein the third guide member has a third vertical surface contacting the first side surface when the photo mask is aligned in the proper position, and a third inclined surface inclined downward from a lower end of the third vertical surface in an inward direction, and
the fourth guide member has a fourth vertical surface contacting the second side surface when the photo mask is aligned in the proper position, and a fourth inclined surface inclined downward from a lower end of the fourth vertical surface in an inward direction.

11. A photo mask stocker, comprising:
a loading unit for receiving a container in which a photo mask is stored and opening the container to expose the photo mask; and
an inspection unit connected to the loading unit, and reading information related to the photo mask to obtain information on the photo mask,
wherein the inspection unit includes:
a stage on which the photo mask is seated; and
an aligning module for pushing the photo mask in one direction while the photo mask is seated on the stage and aligning the photo mask, and
wherein the state includes,
a first guide member for supporting a first corner portion where a first side surface and a second side surface of the photo mask meet, and
a second guide member positioned diagonally from the first corner portion and supporting a second corner portion where a third side surface and a fourth side surface of the photo mask meet, the second guide member including a first reverse movement prevention surface for supporting a third bottom corner where a bottom surface and the third side surface of the photo mask meet, and inclined upward in an outward direction away from the photo mask, the first reverse movement prevention surface inclined upward in an outward direction extending to a top surface of the second guide member.

12. The photo mask stocker of claim 11, wherein
the aligning module includes a pushing member for pushing the photo mask in a diagonal direction from the second corner portion toward the first corner portion.

13. The photo mask stocker of claim 12, wherein the push member includes:
an actuator; and
a push finger moved in the diagonal direction by the actuator and brought into contact with the second corner portion of the photo mask.

14. The photo mask stocker of claim 13, wherein the push finger includes:
fingers which are in contact with the third side surface and the fourth side surface, respectively; and
an elastic member for mitigating shock when the fingers are in contact with the photo mask.

15. The photo mask stocker of claim 12, wherein the push member shifts the photo mask in a non-contact manner by spraying Clean Dry Air (CDA) to the third side surface and the fourth side surface.

16. The photo mask stocker of claim 12, wherein the push member includes:
a first air shift nozzle provided to face the third side surface and spraying air toward the third side surface; and
a second air shift nozzle provided to face the fourth side surface and spraying air toward the fourth side surface, and
the first air shift nozzle and the second air shift nozzle include spray holes provided along a horizontal direction, and
the spray holes are provided so that diameters increase as distances from the second corner portion increase.

17. The photo mask stocker of claim 12, wherein the first guide member further includes:
a second position determining block for supporting a second bottom corner where the bottom surface and the second side surface of the photo mask meet, and
the second position determining block has:
a first end inclined upward in an outward direction away from the photo mask;
a vertical surface extending in a vertical direction from an outer end of the first end; and
a second end inclined upward in an outward direction from an upper end of the vertical surface.

18. The photo mask stocker of claim 12, wherein the second guide member further includes:
a second reverse movement prevention surface for supporting a fourth bottom corner where the bottom surface and the fourth side surface of the photo mask meet, and inclined upward in an outward direction away from the photo mask.

19. The photo mask stocker of claim 12, further comprising:
a third guide member for supporting a third corner portion where the first side surface and the third side surface of the photo mask meet; and
a fourth guide member for supporting a fourth corner portion where the second side surface and the fourth side surface of the photo mask meet and positioned diagonally from the third corner portion, and
each of the third guide member and the fourth guide member has:

a first end inclined upward in an outward direction away from the photo mask; and a vertical surface extending in a vertical direction from an outer end of the first end and provided to face the first side surface.

20. A photo mask stocker, comprising:

a loading unit for receiving a container in which a photo mask is stored and opening the container to expose the photo mask;

an inspection unit connected to the loading unit, and reading information related to the photo mask to inspect the photo mask, and a storage unit for storing the photo mask that has been inspected by the inspection unit, wherein the inspection unit includes:

a stage including a first guide member supporting a first corner portion where a first side surface and a second side surface of the photo mask meet, and a second guide member positioned diagonally from the first corner portion and supporting a second corner portion where a third side surface and a fourth side surface of the photo mask meet;

a pushing member for pushing the photo mask in a diagonal direction from the second corner portion toward the first corner portion in a state in which the photo mask is seated on the first guide member and the second guide member and aligning the photo mask; and a vision module for obtaining information from the photo mask positioned on the stage at a proper position by the push member or inspecting the photo mask, wherein the first guide member includes a first position determining block for supporting a first bottom corner where a bottom surface and the first side surface of the photo mask meet, and wherein the second guide member includes a first reverse movement prevention surface for supporting a third bottom corner where a bottom surface and the third side surface of the photo mask meet, and inclined upward in an outward direction away from the photo mask, the first reverse movement prevention surface inclined upward in an outward direction extending to a top surface of the second guide member.

\* \* \* \* \*